(12) United States Patent
Zheng et al.

(10) Patent No.: US 12,113,179 B2
(45) Date of Patent: Oct. 8, 2024

(54) METHOD FOR SORTING LITHIUM CELLS

(71) Applicant: UNIVERSITY OF SHANGHAI FOR SCIENCE AND TECHNOLOGY, Shanghai (CN)

(72) Inventors: YueJiu Zheng, Shanghai (CN); Hang Wu, Shanghai (CN); Wei Yi, Shanghai (CN); Long Zhou, Shanghai (CN); Xin Lai, Shanghai (CN)

(73) Assignee: University of Shanghai for Science and Technology, Shanghai (CN)

( * ) Notice: Subject to any disclaimer, the term of this patent is extended or adjusted under 35 U.S.C. 154(b) by 638 days.

(21) Appl. No.: 17/312,409

(22) PCT Filed: Jul. 22, 2020

(86) PCT No.: PCT/CN2020/103383
§ 371 (c)(1),
(2) Date: Jun. 10, 2021

(87) PCT Pub. No.: WO2021/258471
PCT Pub. Date: Dec. 30, 2021

(65) Prior Publication Data
US 2022/0320604 A1    Oct. 6, 2022

(30) Foreign Application Priority Data
Jun. 24, 2020    (CN) ......................... 202010588004.1

(51) Int. Cl.
*H01M 10/42*    (2006.01)
*B07C 5/344*    (2006.01)
*G01R 31/382*    (2019.01)

(52) U.S. Cl.
CPC ......... *H01M 10/4221* (2013.01); *B07C 5/344* (2013.01); *G01R 31/382* (2019.01); *H01M 10/42* (2013.01)

(58) Field of Classification Search
CPC .............. B07C 5/344; H01M 10/4221; H01M 10/0525; H01M 10/42; H01M 10/4285; H01M 10/54; G01R 31/382
See application file for complete search history.

(56) References Cited

FOREIGN PATENT DOCUMENTS

| CN | 106597310 A | 4/2017 |
|----|-------------|--------|
| CN | 106824831 A | 6/2017 |
| CN | 109877064 A | 6/2019 |
| CN | 110935655 A | 3/2020 |

OTHER PUBLICATIONS

International Search Report in PCT/CN2020/103383, issued by ISA, dated Mar. 11, 2021.
Written Opinion of the International Search Report in PCT/CN2020/103383, issued by ISA, dated Mar. 11, 2021.

*Primary Examiner* — Michael McCullough
*Assistant Examiner* — Kalyanavenkateshware Kumar
(74) *Attorney, Agent, or Firm* — Zhu Lehnhoff LLP

(57) ABSTRACT

The present invention provides a method for sorting lithium cells, which includes quick sorting and high-precision sorting. The method provided by the present invention can be used for quickly and accurately classifying cells based on self-discharge, and is applicable to large-scale self-discharge sorting due to low cost of adopted equipment. Through the quick sorting method and the high-precision sorting method in the present invention, cells with large self-discharge rates can be eliminated from a batch of cells, cells with similar self-discharge rates can be sorted into groups, and an application range is wider.

6 Claims, 6 Drawing Sheets

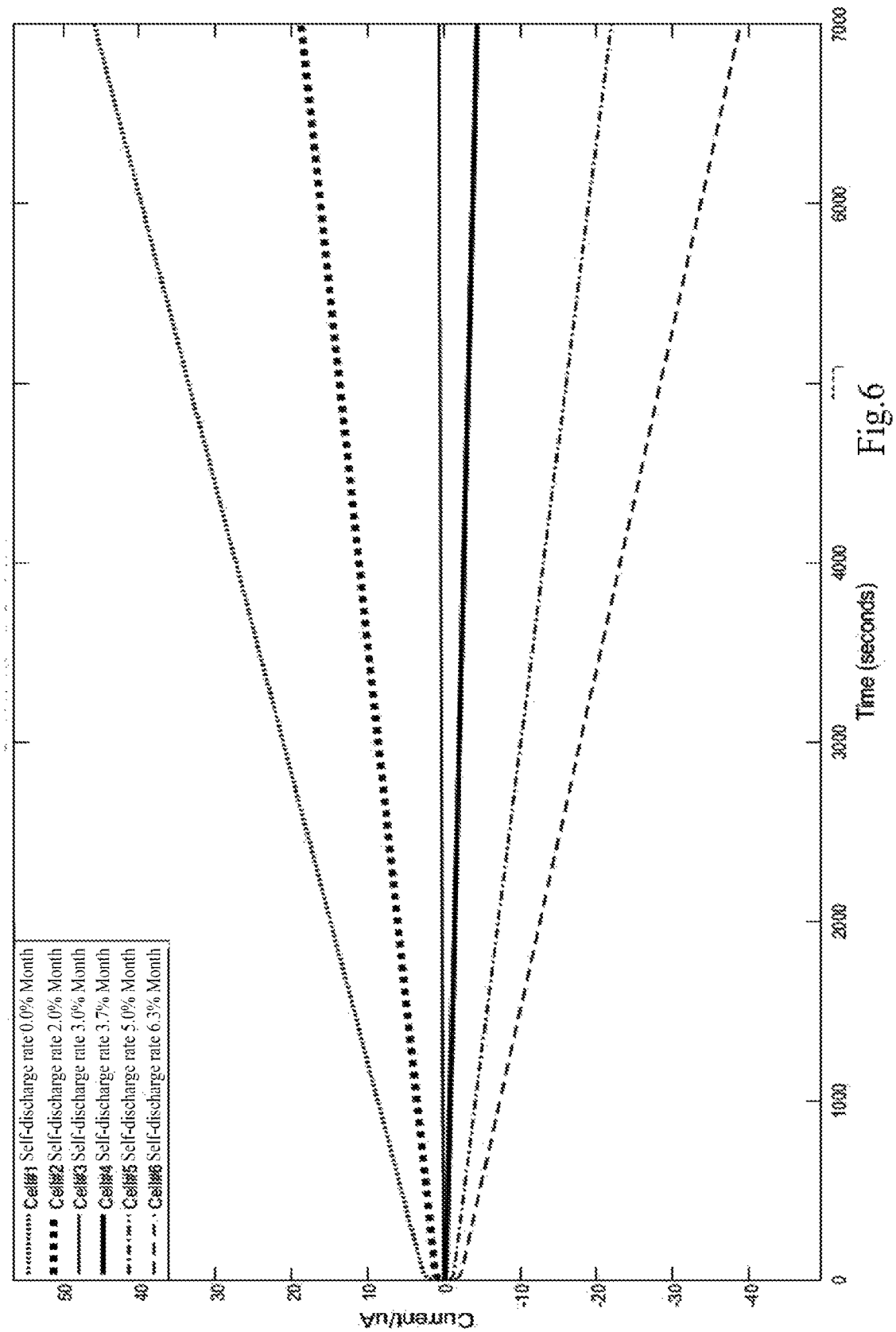

METHOD FOR SORTING LITHIUM CELLS

TECHNICAL FIELD

The present invention relates to the technical field of cell sorting, and more particularly, to a method for sorting lithium cells.

BACKGROUND ART

With the more and more widespread application of electric vehicles in the field of civil use, a battery system as one of the most important systems of electric vehicles has received more and more attention. Under the limitation of the voltage and capacity of single batteries, automotive lithium batteries are connected into groups in a parallel-series connection manner to meet the use requirements of electric vehicles. However, it has been found, in practical applications, that the cycle life and performance of battery packs is much lower than the level of single batteries before the series-parallel connection. Good consistency of batteries in battery packs must be ensured to improve the cycle life and performance of battery packs. The commonly used evaluation indexes of battery pack consistency include SOC, internal resistance, capacity, coulomb efficiency, decay rate, and self-discharge rate. Under the limitation of cost and technical conditions, the current common indexes to meet battery pack consistency are the consistency of SOC, capacity, internal resistance, etc. However, the consistency of SOC, capacity, and internal resistance to be ensured is called "pseudo-consistency", and the consistency of battery packs will be destroyed with the accumulation of time. The consistency of battery packs can be better ensured by ensuring the consistency of coulomb efficiency, decay rate, and self-discharge rate.

Because an aging experiment takes a long time, the consistency of the decay rate can only be ensured from a battery manufacturing stage at the present stage. The coulomb efficiency of batteries is related to the self-discharge rate and the decay rate. However, it is extremely difficult to obtain the coulomb efficiency that makes it difficult to sort batteries according to the coulomb efficiency of batteries. Jeff Dahn et al. studied an ultra-high-precision coulomb efficiency measurement method. However, this method is costly and difficult for large-scale cell sorting. Zheng et al. studied coulomb efficiency differences between series batteries, but the consumed time is longer. In contrast, cell sorting based on a self-discharge rate is easier to implement, and the research on the self-discharge rate of battery packs has extremely important significance. Self-discharge rate differences will lead to SOC differences between single cells of battery packs. If there is a battery with a large self-discharge rate in a battery pack, the cycle life and performance of the battery pack will be obviously reduced. Generally, when the self-discharge rate of cells is between 2% and 5%/month, the use requirements can be met. At present, a conventional screening method includes: measuring the voltage of two ends of a cell after keeping the cell open-circuit for a long time. The method is long in time consumption and high in cost. Li Gechen et al. studied a new method to measure a self-discharge rate of a battery, which takes 12 hours to calculate the self-discharge rate of the battery. The method is extremely large in calculated amount, hundreds of thousands of calculations are needed, the requirements on equipment are high, and the method is not applicable to large-scale sorting.

SUMMARY OF THE INVENTION

An objective of the present invention is to provide a method for sorting lithium cells, which can sort large-batch cells into groups within a short time and is low in screening cost.

To achieve the above objective, the present invention provides a method for sorting lithium cells, including: quick sorting and high-precision sorting.

The quick sorting includes the following steps:
step 1: equalizing factory-fresh cells;
step 2: randomly selecting a certain number of cells, connecting the plurality of cells into a single-ammeter parallel circuit in parallel, monitoring a current change of an ammeter, judging, according to monitoring data, whether there are cells with large self-discharge, if no, sorting the cells into groups, and if yes, proceeding to step 3; and
step 3: connecting a high-precision ammeter to each branch of the circuit of parallel connection of the plurality of cells, finding out cells with greatly different self-discharge rates according to an established equivalent circuit model with self-discharge, and sorting the remaining cells into groups.

The high-precision sorting includes the following steps:
step a: equalizing factory-fresh cells; and
step b: randomly selecting a certain number of cells, connecting the batch of cells in parallel, connecting a high-precision ammeter to each branch, observing a current change in each branch, eliminating a cell with a large relative self-discharge rate according to an established equivalent circuit model with self-discharge, and sorting the remaining cells with similar relative self-discharge rates into groups.

Further, in step 1 and step a, the cell equalizing does not last for 3 h, equalizing equipment is an annular conveying device, and the cells are conveyed into the device for equalizing from an equalizing inlet and are conveyed out from an equalizing outlet after equalizing.

Further, in step 2 and step bZ red, the cell with large self-discharge is a cell with a relative self-discharge rate of more than 3%/month.

Further, in step 2, a reference cell with a known self-discharge rate is connected to a circuit where an ammeter is located, a threshold S is set, and the batch of cells may be considered to include a cell with a self-discharge rate larger than the self-discharge rate of the reference cell if a current change quantity of the ammeter exceeds the threshold S within a specified time.

Further, in step 3, the function of connecting a high-precision ammeter to each branch is to find out a cell with a larger self-discharge rate in the batch of cells and eliminate the cell.

Further, in step b, the function of connecting a high-precision ammeter to each branch is to sort cells with similar relative self-discharge rates into groups.

A cell with a known self-discharge rate is connected in a high-precision sorting scheme, a current change quantity of a branch where the cell with the known self-discharge rate is located is compared with the current change quantity collected by the high-precision ammeter in real time within the specified time, and cells with self-discharge rates of about 1%, 2%, 3%, 4%, and 5% are distinguished and sorted into groups respectively.

Further, the equivalent circuit model with the self-discharge rate refers to a model established for calculating the self-discharge rate of each cell, and a Rint model is adopted for modeling due to no dynamic working conditions in a battery screening process; and in the calculation, a cell with a self-discharge rate is considered as a self-discharge internal resistor connected to the Rint model in parallel, and current flowing through the self-discharge internal resistor is considered as a self-discharge current, so that the self-discharge rate of each cell is calculated.

Compared with the existing technology, the present invention has the advantages that the method provided by the present invention can be used for quickly and accurately classifying cells based on self-discharge, and is applicable to large-scale self-discharge sorting due to low cost of adopted equipment.

Through the quick sorting method and the high-precision sorting method in the present invention, cells with large self-discharge rates can be eliminated from a batch of cells, cells with similar self-discharge rates can be sorted into groups, and an application range is wider.

BRIEF DESCRIPTION OF THE DRAWINGS

FIG. 6 is a diagram illustrating a current change of an ammeter of each branch in step b in a high-precision sorting scheme according to an embodiment of the present invention.

DETAILED DESCRIPTION OF THE INVENTION

In order that the objectives, technical solutions, and advantages of the present invention will become more apparent, the technical solutions of the present invention will be further described below.

Figure 1:
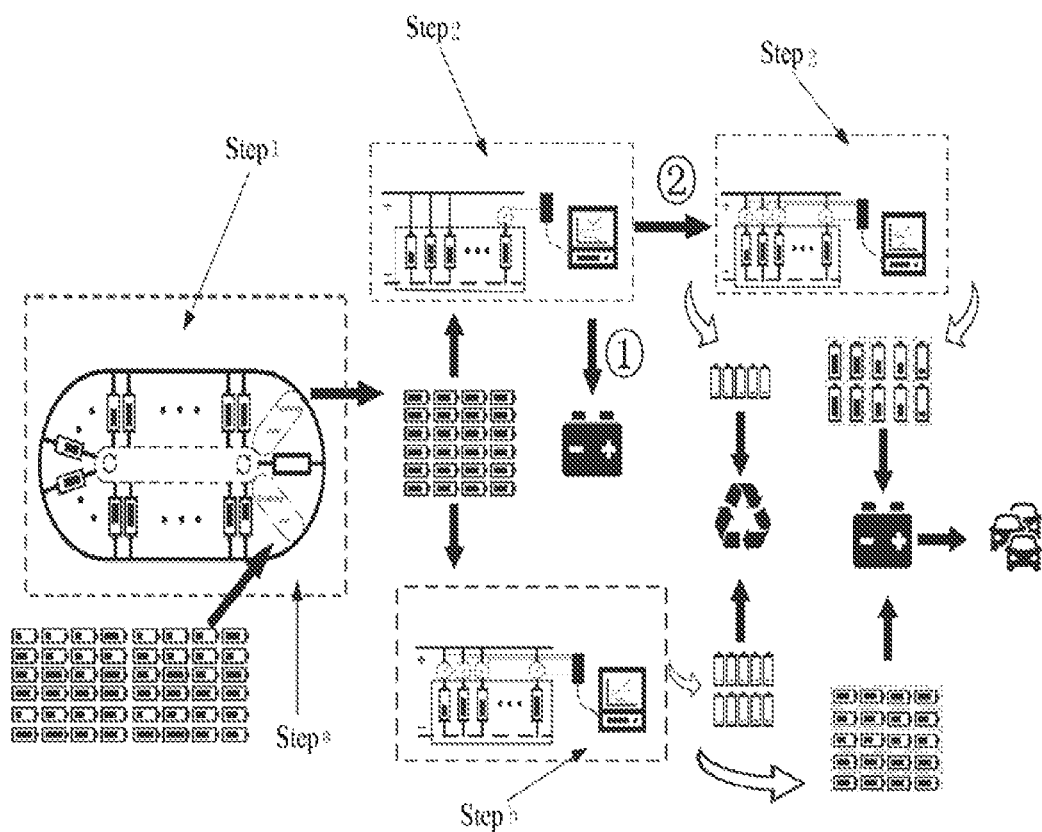
FIG. 1 is a flowchart illustrating lithium cell sorting according to an embodiment of the present invention.

As shown in FIG. 1, the present invention provides a method for sorting lithium cells, including: quick sorting and high-precision sorting.

The quick sorting includes the following steps:

At step 1, factory-fresh cells are equalized, where the equalization is carried out in a manner of "one-in one-out", and will not last for 3 h. Equalizing equipment is an annular conveying device, and the equalization starts after batteries are conveyed into an equalizing inlet, and ends after the batteries are conveyed out of an equalizing outlet.

Figure 2:
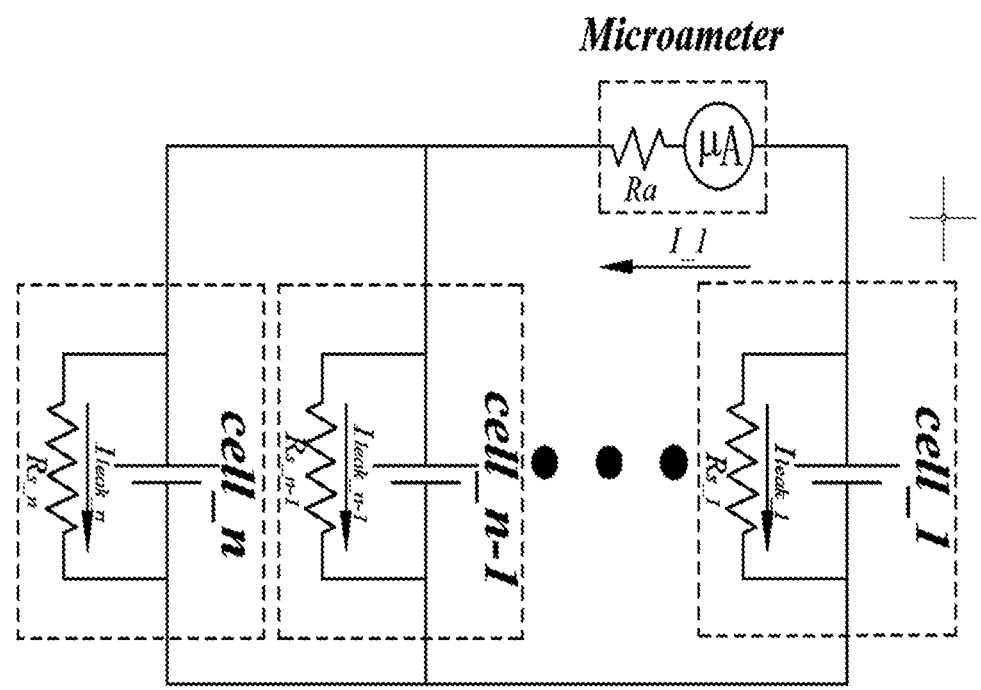
FIG. 2 is a schematic diagram illustrating an overall structure of a single-ammeter parallel circuit according to an embodiment of the present invention.

At step 2, as shown in FIG. 2, a certain number of cells are randomly selected and connected into a single-ammeter parallel circuit in parallel, a current change of an ammeter is monitored, whether there is a cell with large self-discharge is judged according to monitoring data, if no, the cells are sorted into groups, and if yes, the process proceeds to step 3.

In step 2, the number of selected cells to be screened is irrelevant to the number of high-precision ammeters connected to the circuit, only one high-precision ammeter needs to be connected to a first branch while a threshold S is set, and the batch of cells may be considered to include a cell with a larger self-discharge rate. As shown in FIG. 2, the principle of single-ammeter screening is as follows: cells have self-discharge rates more or less, and the SOC of a cell with a high self-discharge rate is reduced faster than that of a cell with a low self-discharge rate, which will cause an open-circuit voltage difference between the cells. Whether the cells connected to the parallel circuit include a cell with a larger self-discharge rate can be judged by observing a current change of a branch through the high-precision ammeter. After cells to be sorted are connected to the parallel circuit, if the batch of batteries do not include a cell with a larger self-discharge rate, a voltage difference between the cells will be continuously reduced as the open-circuit voltage of the cells continuously tends to be consistent due to the existence of a self-equalizing current, and a continuously reduced current curve is displayed on the high-precision ammeter accordingly. If there is a cell with a larger self-discharge rate, a voltage difference between the cell and the remaining normal cells is increased continuously, the self-equalizing current in the parallel circuit will be increased continuously, and a continuously increased current curve is displayed on the high-precision ammeter accordingly. By observing the trend of the circuit curve, whether grouping conditions are satisfied in the batch of cells can be judged.

Figure 3:
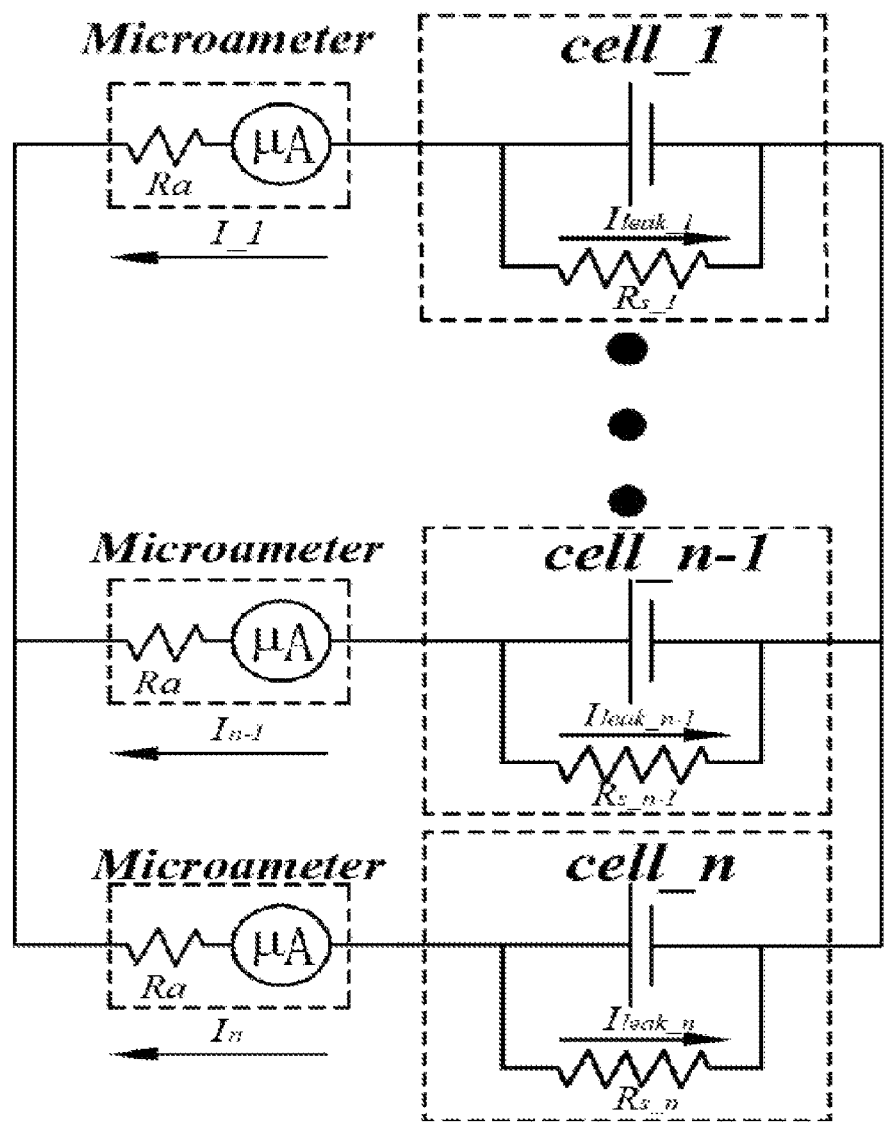
FIG. 3 is a schematic diagram illustrating an overall structure of a multi-ammeter parallel circuit according to an embodiment of the present invention.

At step 3, as shown in FIG. 3, a high-precision ammeter is connected to each branch of the circuit of parallel connection of the plurality of cells, cells with large self-discharge rates are found out according to an established equivalent circuit model with self-discharge, and the remaining cells are sorted into groups.

A high-precision ammeter is connected to each branch to monitor a current change of each branch, and a relative self-discharge rate between the cells is calculated according to an established equivalent circuit model. As shown in FIG. 3, at an initial moment, an open-circuit voltage difference between the cells is not large due to equalization in advance. However, with the accumulation of time, the SOC of a cell with a large self-discharge rate is reduced greatly, a voltage difference between normal cells and the cell with the large self-discharge rate appears, the ammeter has the same potential at the left end, and the change of a current representation number depends on the positive potential of each cell. The normal cells may continuously charge the cell with self-discharge due to a self-equalizing phenomenon in the parallel circuit. Compared with a reference cell, the self-equalizing current of a cell with a higher self-discharge rate is increased obviously, while the self-equalizing current of a cell with a lower self-discharge rate is increased slowly, and the self-equalizing current of the normal cells tends to be stable. A relative self-discharge rate of each cell can be determined by observing the change of the current representation number of each branch.

In step 3, the function of connecting a high-precision ammeter to each branch is to find out a cell with a larger self-discharge rate in the batch of cells and eliminate the cell.

The high-precision sorting includes the following steps:

At step a, factory-fresh cells are equalized, where similar to step 1, the equalization is carried out in a manner of "one-in one-out", and will not last for 3 h.

At step b, a certain number of cells are randomly selected. As shown in FIG. 3, the batch of cells are connected in parallel, a high-precision ammeter is connected to each branch, a current change in each branch is observed, a cell with a large relative self-discharge rate is eliminated according to an established equivalent circuit model with self-discharge, and the remaining cells with similar relative self-discharge rates are sorted into groups.

In step b, the screening principle of a multi-ammeter parallel circuit is as described in step 3. In step b, the function of introducing a high-precision ammeter is to sort cells with similar self-discharge rates into groups. A cell with a known self-discharge rate is connected in a high-precision sorting scheme, a current change quantity of a branch where the cell with the known self-discharge rate is located is compared with the current change quantity collected by the high-precision ammeter in real time within the specified time, and cells with self-discharge rates of about 1%, 2%, 3%, 4%, and 5% are distinguished and sorted into groups respectively.

The advantages of the present invention will be further explained by specific experimental data as follows:

At step 1, 8 soft-packed lithium cells with the capacity of 26 Ah are put into equalizing equipment and equalized for 3 hours at normal temperature.

Figure 4:
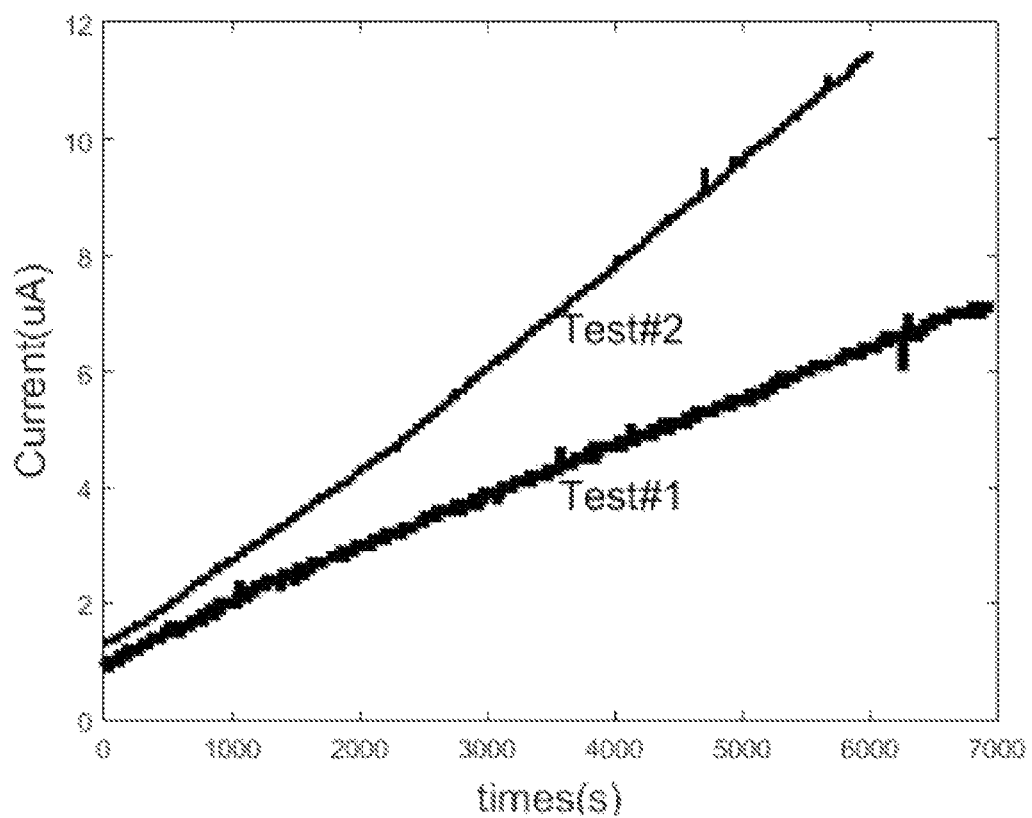
FIG. 4 is a diagram illustrating a self-equalizing current change in step 2 in a quick sorting scheme according to an embodiment of the present invention.

At step 2, the equalized cells are connected to a single-ammeter parallel circuit, and four of the cells are marked as cell #1, cell #2, cell #3, and cell #4 respectively. A circuit diagram is shown in FIG. 2. The measuring range of a high-precision ammeter connected to the circuit is 0-1000 μA, and the internal resistance is 10Ω. In order to obtain a cell with a high self-discharge rate, self-discharge is simulated by connecting a resistor to the cell in parallel in combination with Equation 1. Cell parameters used in the experiment and experiment parameter settings are shown in Tables 1 and 2. A threshold S is obtained through the experiment, when a current value change exceeds S within 2 h, the batch of cells are connected to a multi-ammeter parallel circuit for further sorting, and if the current value change does not exceed S, the cells can be sorted into groups. The experimental results of Test #1 and Test #2 in a single-ammeter scheme are shown in FIG. 4.

$$D_r = \frac{\frac{U_{ocv}}{R_s} * 24 * 30}{C} * 100\% \qquad (1)$$

TABLE 1

Experimental parameter settings of quick sorting scheme

| Experiment code | Battery code | Parallel resistance/ self-discharge rate |
|---|---|---|
| Test#1 | Cell#1 | ∞ Ω/0% |
| | Cell#2 | ∞ Ω/0% |
| | Cell#3 | ∞ Ω/0% |
| | Cell#4 | 3000Ω/3% |
| Test#2 | Cell#1 | ∞ Ω/0% |
| | Cell#2 | ∞ Ω/0% |
| | Cell#3* | 3000Ω/3% |
| | Cell#4 | 2000Ω/5% |

Note:
*indicates a known cell self-discharge rate

As required, it is generally considered that the use requirements can be met when the cell self-discharge rate is 3%/month. Test #1 simulates the existence of a cell with a self-discharge rate of 3%/month. Test #2 simulates the existence of a cell with a self-discharge rate of 5%/month. According to the experimental results, as shown in FIG. 4, at 6000 s, the current change ΔI is equal to 5.5 μA in Test #1, where ΔI≤S, and sorting grouping requirements are met. The current change ΔI is equal to 10.1 μA in Test #2, where ΔI>S, and the cell is connected to the multi-ammeter parallel circuit for further sorting.

Figure 5:
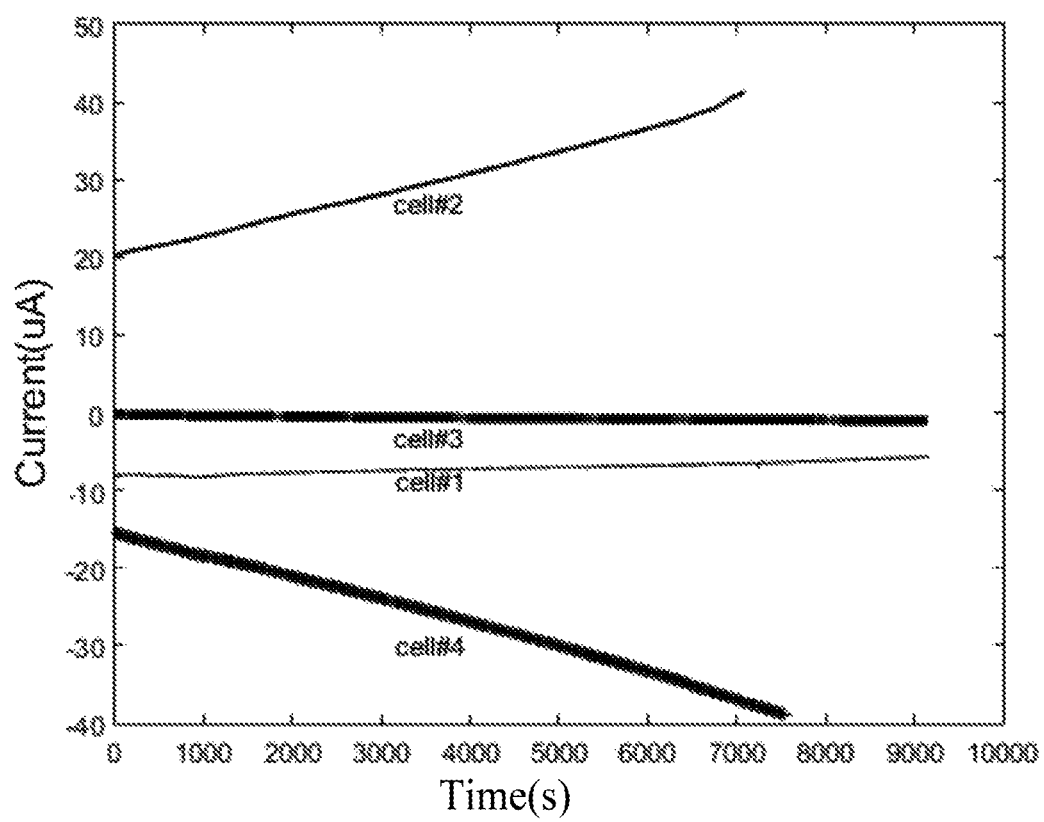
FIG. 5 is a diagram illustrating a self-equalizing current of each branch in step 3 in a quick sorting scheme according to an embodiment of the present invention.

At step 3, the cells which do not meet the grouping requirements in step 2 are connected to the multi-ammeter parallel circuit. A circuit connection diagram is shown in FIG. 3. After putting for a period of time, experimental data is obtained as shown in FIG. 5 and Table 3:

TABLE 2

Experimental data table of each branch

| Experiment code | Cell code | Self-discharge rate | Δt (s) | Initial current (μA) | End current (μA) | ΔI (μA) |
|---|---|---|---|---|---|---|
| Test#2 | cell#1 | 0% | 7000 | −8.1 | −6.5 | 1.6 |
| | cell#2 | 0% | 7000 | 20.3 | 40.8 | 20.5 |
| | cell#3 | 3% | 7000 | −0.2 | −0.9 | −0.7 |
| | cell#4 | 5% | 7000 | −15.5 | −36.9 | −21.4 |

Each branch current is analyzed based on Test #2: At an initial stage, the open-circuit voltage of two ends of cell #2 is high, and due to the self-equalizing phenomenon in the parallel circuit, cell #2 charges the remaining three cells. At this stage, the voltage difference between a cell with a low self-discharge rate and cell #2 will be gradually reduced with the effect of equalization, and accordingly the branch current is embodied in that the self-equalizing current continuously tends to be stable with the passage of time. It is difficult for the self-equalizing current in the parallel branch to make up for the power loss of a cell with a higher self-discharge rate due to serious internal electric leakage. The pressure difference between the cell and cell #2 will be increased continuously. The branch current is embodied in that the self-equalizing current changes continuously, and the change trends more obviously as the self-discharge rate is larger. From the above analysis, it can be determined that cell #1 and cell #2 satisfy the grouping conditions, the self-discharge rate of cell #3 is known to be 3%/month, and the self-discharge rate of cell #4 is larger. According to the experimental results, cell #4 is eliminated, and the remaining cells are sorted into groups.

The high-precision sorting scheme in technical route 2 includes the following steps:

At step a, 8 soft-packed lithium cells with the capacity of 26 Ah are put into equalizing equipment and equalized for 3 hours at normal temperature.

At step b, a certain number of cells already equalized in step a are randomly selected, the batch of cells are connected to a multi-ammeter circuit, and a current change in each branch is observed in real time. In order to show that the sorting precision of a high-precision ammeter is determined by the degree of cells with known self-discharge rates connected to a circuit, cells with self-discharge rates of 3%/month and 5%/month are connected to the circuit, cells with self-discharge rates lower than 3%/month and cells with self-discharge rates between 3%/month and 5%/month are sorted into groups, and cells with self-discharge rates higher than 5%/month are eliminated. Experiment parameter settings are shown in Table 4.

TABLE 3

Experimental parameter settings of high-precision sorting scheme

| Experiment code | Battery code | Parallel resistance/ self-discharge rate |
|---|---|---|
| Test#3 | Cell#1* | ∞ Ω/0% |
|  | Cell#2 | 5000 Ω/2% |
|  | Cell#3* | 3000 Ω/3% |
|  | Cell#4 | 2700Ω/3.7% |
|  | Cell#5* | 2000Ω/5% |
|  | Cell#6 | 1600Ω/6.3% |

Note:
*indicates a known cell self-discharge rate

The 6 cells are connected to a full-ammeter circuit, and after the cells are put for 7000 s, a current change quantity of each branch recorded by a high-precision ammeter in each branch is as shown in Tables 5 and 6:

TABLE 4

Experimental data table of each branch

| Experiment code | Cell code | Self-discharge rate | $\Delta t$ (s) | Initial current ($\mu A$) | End current ($\mu A$) | $\Delta I$ ($\mu A$) |
|---|---|---|---|---|---|---|
| Test#1 | Cell#1 | 0%/month | 7000 | 1.6045 | 45.9009 | 44.2964 |
|  | Cell#2 | 2%/month | 7000 | 0.6554 | 18.7502 | 18.0948 |
|  | Cell#3 | 3%/month | 7000 | 0.0227 | 0.6496 | 0.6269 |
|  | Cell#4 | 3.7%/month | 7000 | −0.1531 | −4.3784 | −4.2253 |
|  | Cell#5 | 5%/month | 7000 | −0.7682 | −21.9764 | −21.2082 |
|  | Cell#6 | 6.3%/month | 7000 | −1.3613 | −38.9460 | −37.5847 |

Based on a full-ammeter scheme Test #1, each branch current is analyzed, Cell #1 is a normal cell with a self-discharge rate of 0%/month, Cell #3 is a cell with a self-discharge rate of 3%/month, and Cell #5 is a cell with a self-discharge rate of 5%/month. If the batch of cells include a cell with a smaller self-discharge rate, the pressure difference between the cell and Cell #1 is gradually reduced along with the self-equalizing effect of the parallel circuit, the self-equalizing current is reflected in a curve with a continuously reduced slope, and it can be determined from FIG. 6 that there is no cell with a self-discharge rate of about 0%/month. The self-discharge rate of a cell with the current change quantity between the change quantities of Cell #1 and Cell #3 is between 0%/month and 3%/month, the self-discharge rate of a cell with the current change quantity between the change quantities of Cell #3 and Cell #5 is between 3%/month and 5%/month, and the self-discharge rate of a cell with the current change quantity larger than the change quantity of Cell #5 is required to be higher than 5%/month. Based on the above analysis results, Cell #1 and Cell #2 can be sorted into a group, Cell #3, Cell #4 and Cell #5 can be sorted into a group, and Cell #6 is eliminated.

The sorting precision of this method is determined by cells with known self-discharge rates connected to a circuit, data collected by the high-precision ammeter in real time is compared with data collected by the high-precision ammeter of a branch where the cells with known self-discharge rates are located, and the relative self-discharge rate of each cell can be determined. At most 8 cells are used in the above experiment for verification, the number of cells can be further increased in practical applications, and the screening time will not be prolonged. This method can be used for quickly and accurately classifying cells based on self-discharge, and is applicable to large-scale self-discharge sorting due to low cost of adopted equipment.

The above descriptions are only preferred embodiments of the present invention and are not intended to limit the present invention in any way. Any person skilled in the art, without departing from the technical solution of the present invention, can make any form of equivalent substitutions or modifications of the technical solution and the technical content disclosed in the present invention, which still fall within the scope of protection of the present invention without departing from the technical solution of the present invention.

The invention claimed is:

1. A method for sorting lithium cells, comprising: quick sorting and high-precision sorting,
   wherein the quick sorting comprises the following steps:
   step 1: equalizing factory-fresh cells;
   step 2: randomly selecting a certain number of cells, connecting the plurality of cells into a single-ammeter parallel circuit in parallel, monitoring a current change of an ammeter, judging, according to monitoring data, whether there are cells with large self-discharge, if no, sorting the cells into groups, and if yes, proceeding to step 3; and
   step 3: connecting an ammeter to each branch of the circuit of parallel connection of the plurality of cells, finding out cells with greater self-discharge rates than other cells according to an established equivalent circuit model with self-discharge, and sorting the remaining cells into groups;
   wherein the high-precision sorting comprises the following steps:
   step a: equalizing the factory-fresh cells; and
   step b: randomly selecting a certain number of cells, connecting the batch of cells in parallel, connecting the ammeter to each branch, observing a current change in each branch, eliminating a cell with a large relative self-discharge rate according to an established equivalent circuit model with self-discharge, and sorting the remaining cells with similar self-discharge rates into groups; and
   wherein in step b, the function of connecting an ammeter to each branch is to sort cells with similar relative self-discharge rates into groups:
   a cell with a known self-discharge rate is connected in a high-precision sorting scheme, a current change quantity of a branch where the cell with the known self-discharge rate is located is compared with the current change quantity collected by the ammeter in real time within the specified time, and cells with self-discharge rates of 1%, 2%, 3%, 4%, and 5% are distinguished and sorted into groups respectively.

2. The method for sorting lithium cells according to claim 1, wherein in step 1 and step a, the cell equalizing does not exceed 3 hours in time.

3. The method for sorting lithium cells according to claim 1, wherein in step 2 and step b, the cell with large self-discharge is a cell with a relative self-discharge rate of more than 3%/month.

4. The method for sorting lithium cells according to claim 1, wherein in step 2, a reference cell with a known self-discharge rate is connected to a circuit where an ammeter is located, a threshold S is set, and the batch of cells may be considered to comprise a cell with a self-discharge rate larger than the self-discharge rate of the reference cell if a current change quantity of the ammeter exceeds the threshold S within a specified time.

5. The method for sorting lithium cells according to claim 1, wherein in step 3, the function of connecting the ammeter to each branch is to find out a cell with a larger self-discharge rate in the batch of cells and eliminate the cell.

6. The method for sorting lithium cells according to claim 1, wherein the equivalent circuit model with the self-discharge rate refers to a model established for calculating the self-discharge rate of each cell, and a Rint model is adopted for modeling due to no dynamic working conditions in a battery screening process; and in the calculation, a cell with a self-discharge rate is considered as a self-discharge internal resistor connected to the Rint model in parallel, and current flowing through the self-discharge internal resistor is considered as a self-discharge current, so that the self-discharge rate of each cell is calculated.

* * * * *